(12) United States Patent
Nolten

(10) Patent No.: US 12,500,152 B2
(45) Date of Patent: Dec. 16, 2025

(54) POWER SEMICONDUCTOR MODULE, METHOD FOR ASSEMBLING A POWER SEMICONDUCTOR MODULE AND HOUSING FOR A POWER SEMICONDUCTOR MODULE

(71) Applicant: Infineon Technologies AG, Neubiberg (DE)

(72) Inventor: Ulrich Nolten, Rüthen (DE)

(73) Assignee: Infineon Technologies AG, Neubiberg (DE)

( * ) Notice: Subject to any disclaimer, the term of this patent is extended or adjusted under 35 U.S.C. 154(b) by 494 days.

(21) Appl. No.: 18/070,552

(22) Filed: Nov. 29, 2022

(65) Prior Publication Data

US 2023/0170287 A1   Jun. 1, 2023

(30) Foreign Application Priority Data

Nov. 29, 2021 (EP) ..................... 21211013

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4817* (2013.01); *H01L 21/4853* (2013.01);
(Continued)

(58) Field of Classification Search
CPC ............. H01L 23/562; H01L 23/49811; H01L 21/4817; H01L 21/4853; H01L 24/32; H01L 24/48; H01L 24/73; H01L 25/072; H01L 2224/32225; H01L 2224/48225; H01L 2224/73265; H01L 2924/13055; H01L 2924/1611; H01L 2924/16153; H01L 2924/16251; H01L 2924/1632;
(Continued)

(56) References Cited

U.S. PATENT DOCUMENTS

2006/0043604 A1   3/2006  Suga et al.
2021/0358820 A1 * 11/2021 Ludwig ................... H01L 23/06

FOREIGN PATENT DOCUMENTS

EP      3460837 A1      3/2019
WO  WO-2017081881 A1 *  5/2017   ........... H01L 23/315

* cited by examiner

*Primary Examiner* — Evan G Clinton
(74) *Attorney, Agent, or Firm* — Murphy, Bilak & Homiller, PLLC

(57) ABSTRACT

A power semiconductor module includes: a substrate with a metallization layer attached to a dielectric insulation layer and a semiconductor body mounted to the metallization layer; a housing at least partly enclosing the substrate and having sidewalls and a cover that at least partly covers an opening formed by the sidewalls and has a flexible portion; and a press-on pin having arranged on the substrate or semiconductor body. A first end of the press-on pin faces the substrate or semiconductor body and extends towards the cover such that a second end of the press-on pin contacts the flexible portion of the cover. The substrate in an area vertically below the press-on pin has a first spring constant $k_1$ in a vertical direction that is perpendicular to a top surface of the substrate. The flexible portion of the cover has a second spring constant $k_2$, where $0.5*k_1 \leq k_2 \leq 5*k_1$.

11 Claims, 5 Drawing Sheets

(51) Int. Cl.
*H01L 23/00* (2006.01)
*H01L 25/07* (2006.01)

(52) U.S. Cl.
CPC .............. *H01L 24/32* (2013.01); *H01L 24/48* (2013.01); *H01L 24/73* (2013.01); *H01L 25/072* (2013.01); *H01L 2224/32225* (2013.01); *H01L 2224/48225* (2013.01); *H01L 2224/73265* (2013.01); *H01L 2924/13055* (2013.01); *H01L 2924/1611* (2013.01); *H01L 2924/16153* (2013.01); *H01L 2924/16251* (2013.01); *H01L 2924/1632* (2013.01); *H01L 2924/1811* (2013.01); *H01L 2924/182* (2013.01)

(58) Field of Classification Search
CPC ....... H01L 2924/1811; H01L 2924/182; H01L 21/50; H01L 24/29; H01L 2023/4081; H01L 2224/291; H01L 2224/2929; H01L 2224/293; H01L 2224/29339; H01L 2224/32227; H01L 2224/45014; H01L 2224/45015; H01L 2224/45099; H01L 2224/48227; H01L 2224/48472; H01L 2224/8384; H01L 2924/1615; H01L 2924/16151; H01L 2924/16152; H01L 2924/181; H01L 2924/3511; H01L 23/4006; H01L 2924/163; H01L 23/3735; H01L 23/4093; H01L 25/18; H01L 23/04; H01L 23/16; H01L 25/50
See application file for complete search history.

POWER SEMICONDUCTOR MODULE, METHOD FOR ASSEMBLING A POWER SEMICONDUCTOR MODULE AND HOUSING FOR A POWER SEMICONDUCTOR MODULE

TECHNICAL FIELD

The instant disclosure relates to a power semiconductor module, a method for assembling a power semiconductor module, and a housing for a power semiconductor module.

BACKGROUND

Power semiconductor modules often include a substrate arranged in a housing. A semiconductor arrangement including a plurality of controllable semiconductor elements (e.g., two IGBTs in a half-bridge configuration) may be arranged on the substrate. The substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may be attached to a heat sink or to a ground surface of the housing. The controllable semiconductor devices are usually mounted onto the substrate by soldering or sintering techniques.

A cover of the housing is often used to exert a force on the substrate such that the substrate, which often has a certain bow, is pressed onto the heat sink or onto the ground surface of the housing. In this way, a good thermal transition between the substrate and the heat sink or ground surface may be achieved. However, assembling such semiconductor module arrangements is often cumbersome and there is the risk of insufficient thermal transition after assembly due to production tolerances.

There is a need for a semiconductor module arrangement that provides a good thermal resistance between the substrate and the heat sink or ground surface of the housing, that is easy to assemble and that is not significantly affected by production tolerances.

SUMMARY

A power semiconductor module arrangement includes at least one substrate including a dielectric insulation layer and a first metallization layer attached to the dielectric insulation layer, at least one semiconductor body mounted to the first metallization layer, a housing at least partly enclosing the substrate, the housing including sidewalls and a cover, the cover at least partly covering an opening formed by the sidewalls and including at least one flexible portion, and at least one press-on pin including a first end and a second end, wherein each press-on pin is arranged either on the substrate or on one of the at least one semiconductor body, wherein the first end of the press-on pin faces the substrate or semiconductor body, and extends from the substrate or the respective semiconductor body towards the cover such that its second end contacts one of the at least one flexible portion of the cover, the substrate in an area vertically below the press-on pin includes a first spring constant $k_1$ in a vertical direction that is perpendicular to a top surface of the substrate, the at least one flexible portion of the cover includes a second spring constant $k_2$, and $0.5*k_1 \le k_2 \le 5*k_1$.

A method includes mounting at least one semiconductor body to a substrate, the substrate including a dielectric insulation layer and a first metallization layer attached to the dielectric insulation layer, arranging a housing to at least partly enclose the substrate, the housing including sidewalls and a cover, the cover at least partly covering an opening formed by the sidewalls and including at least one flexible portion, and exerting pressure on the substrate by means of at least one press-on pin including a first end and a second end, wherein exerting pressure on the substrate by means of at least one press-on pin includes arranging the at least one press-on pin in a final mounting position, in its final mounting position, each press-on pin is arranged either on the substrate or on one of the at least one semiconductor body, wherein the first end of the press-on pin faces the substrate or semiconductor body, and extends from the substrate or the respective semiconductor body towards the cover such that its second end contacts one of the at least one flexible portion of the cover, the substrate in an area vertically below the press-on pin comprises a first spring constant $k_1$ in a vertical direction that is perpendicular to a top surface of the substrate, the at least one flexible portion of the cover comprises a second spring constant $k_2$, and $0.5*k_1 \le k_2 \le 5*k_1$.

A housing includes sidewalls and a cover, the cover at least partly covering an opening formed by the sidewalls and including at least one flexible portion, wherein the housing is configured to at least partly enclose at least one substrate including a dielectric insulation layer and a first metallization layer attached to the dielectric insulation layer, with at least one semiconductor body mounted to the first metallization layer, the substrate in at least a first area includes a first spring constant $k_1$ in a vertical direction that is perpendicular to a top surface of the substrate, the at least one flexible portion of the cover includes a second spring constant $k_2$, and $0.5*k_1 \le k_2 \le 5*k_1$.

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to designate different "elements". That is, e.g., the existence of a "third element" does not require the existence of a "first element" and a "second element". An electrical line or electrical connection as described herein may be a single electrically conductive element, or may include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
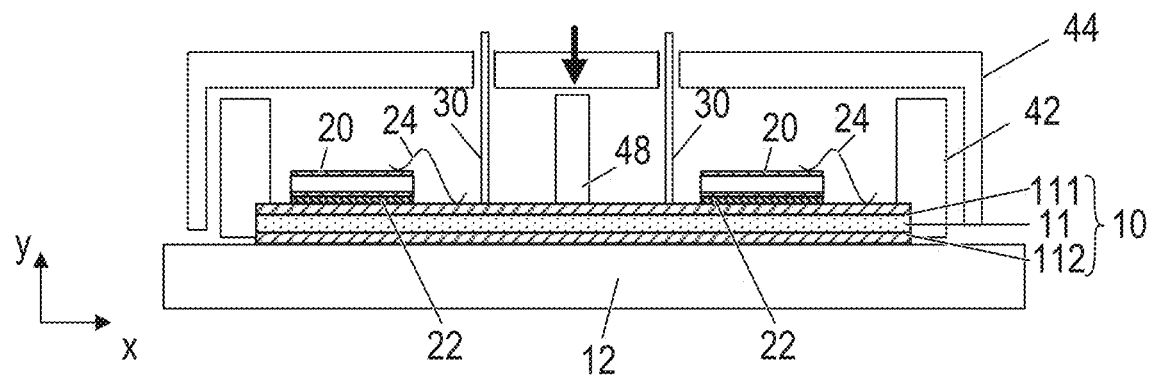
FIG. 1 is a cross-sectional view of a power semiconductor module arrangement.

Referring to FIG. 1, a cross-sectional view of an exemplary power semiconductor module is illustrated. The power semiconductor module includes a housing and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112. It is, however, also possible that the substrate 10 only comprises a first metallization layer 111, and that the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may be, e.g., a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing. In the example illustrated in FIG. 1, the substrate 10 is arranged on a ground surface 12 of the housing. The housing further comprises sidewalls 42 and may further comprise a cover 44. In other examples, however, the ground surface 12 of the housing may be omitted. In such cases the substrate 10 itself may form the ground surface of the housing. The substrate 10 may then be arranged directly on a base plate or heat sink 12, for example. In the example in FIG. 1, only one substrate 10 is arranged on the ground surface, base plate or heat sink 12 (only referred to as ground surface in the following). In some power semiconductor module arrangements, more than one substrate 10 may be arranged in a single housing. The ground surface 12, the sidewalls 42 and the cover 44 may include a metal or a metal alloy, for example. It is, however, also possible that the ground surface 12, sidewalls 42 and cover 44 comprise an electrically insulating material such as a plastic or ceramic material, for example. The housing may also include a liquid crystal polymer, for example.

The substrate 10 may be connected to the ground surface 12 by means of a connection layer (not specifically illustrated in FIG. 1). Such a connection layer may be a solder layer, a layer of an adhesive material, or a layer of a sintered metal powder, e.g., a sintered silver powder, for example. Any other kind of electrically conducting or non-conducting connection layer is also possible.

One or more semiconductor bodies 20 may be arranged on the substrate 10. Each of the semiconductor bodies 20 arranged on the substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 of the example in FIG. 1 is also a continuous layer. However, the first metallization layer 111, the second metallization layer 112 or both can also be structured layers. "Structured layer" means that, e.g., the respective metallization layer 111, 112 is not a continuous layer, but includes recesses between different sections of the layer. Different semiconductor bodies 20 may be mounted on the same or different sections of the first metallization layer 111. Different sections of the first metallization layer 111 may have no electrical connection or may be electrically connected to one or more other sections using, e.g., bonding wires. Electrical connections may also include bonding ribbons, connection plates or conductor rails, for example, to name just a few examples. According to another example, the second metallization layer 112 can be omitted altogether. The one or more semiconductor bodies 20 may be electrically and mechanically connected to the substrate 10 by an electrically conductive connection layer 22. Such an electrically conductive connection layer 22 may be a solder layer, a layer of an electrically conductive adhesive, or a layer of a sintered metal powder, e.g., a sintered silver powder, for example.

The power semiconductor module may further include terminal elements 30. The terminal elements 30 are electrically connected to the substrate 10, e.g., to the first metallization layer 111 of the substrate 10, and form a contact element which provides an electrical connection between the inside and the outside of the housing. A first end of the terminal elements 30 may be electrically and mechanically connected to the first metallization layer 111 by an electrically conductive connection layer (not specifically illustrated). Such an electrically conductive connection layer may be a solder layer, a layer of an electrically conductive adhesive, or a layer of a sintered metal powder, e.g., a sintered silver powder, for example. A second end of the terminal elements 30 protrudes out of the housing to allow the terminal element 30 to be electrically contacted from the outside. The cover 44 may comprise openings through which the terminal elements 30 may protrude such that their first side is inside the housing and their second side is outside the housing. The terminal elements 30 may protrude vertically (i.e., perpendicular to a top surface of the substrate 10) out of the housing when the housing is arranged to surround the substrate 10. According to another example, terminal elements 30 may also protrude horizontally (parallel to the top surface of the substrate 10) through a sidewall 42 of the housing.

Figure 2:
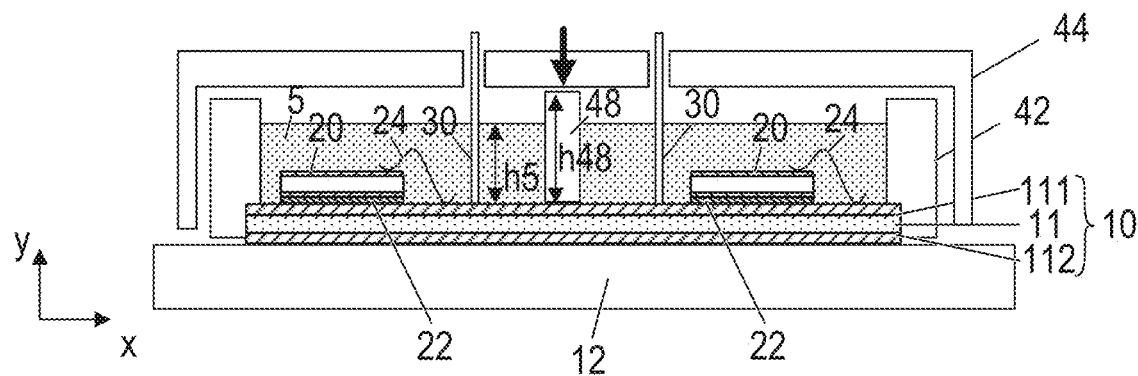
FIG. 2 is a cross-sectional view of a further power semiconductor module arrangement.

A power semiconductor module may further include a casting compound 5, as is illustrated in the example of FIG. 2. The casting compound 5 may consist of or include a silicone gel or may be a rigid molding compound, for example. The casting compound 5 may partly fill the interior of the housing, thereby covering the substrate 10 and the semiconductor bodies 20, and any other components and electrical connections 24 that are arranged on the substrate 10. Electrical connections 24 such as, e.g., bonding wires or bonding ribbons, may electrically couple the semiconductor bodies 20 to the first metallization layer 111, to other semiconductor bodies 20, or to any other components that may be arranged inside the housing. The terminal elements 30 may be partly embedded in the casting compound 5. At least the second ends of the terminal elements 30, however, may not be covered by the casting compound 5 and may protrude from the casting compound 5. The casting compound 5 is configured to protect the components and electrical connections inside the power semiconductor module arrangement, in particular inside the housing, from certain environmental conditions, mechanical damage and insulation faults.

The sidewalls 42 of the housing generally may be mechanically connected to the substrate 10 by means of a joint (not specifically illustrated in the figures). This joint may be a solder joint, a cold welding joint, or an adhesive joint, for example. Any other suitable joints are also possible for mechanically connecting the sidewalls 42 of the housing to the substrate 10, which also provide a suitable seal such that no, or at least less gas can enter the housing 40.

The semiconductor module arrangement further comprises at least one press-on pin 48. The press-on pin 48 is arranged on the substrate 10, for example. In the Figures, the press-on pin 48 is illustrated as being arranged at a certain distance from the different semiconductor bodies 20 in a horizontal direction x. This, however, is only an example. In other examples, the press-on pin 48 may be arranged in close vicinity to at least one of the semiconductor bodies 20. In close vicinity in this context refers to a distance that is shorter than, e.g., 5 mm, 3 mm or 2 mm. According to another example, the press-on pin 48 is arranged on a semiconductor body 20 instead of on the substrate 10. If the press-on pin 48 is arranged on a semiconductor body 20, the respective semiconductor body 20 is arranged between the press-on pin 48 and the substrate 10. The press-on pin 48 may be arranged at a central position within the sidewalls 42. That is, the press-on pin 48 may be arranged at a first distance from a first sidewall and at a second distance from a second sidewall opposite the first sidewall, wherein the first distance (essentially) equals the second distance, and at a third distance from a third sidewall and at a fourth distance from a fourth sidewall opposite the third sidewall, wherein the third distance (essentially) equals the fourth distance.

In the Figures, the press-on pin 48 directly contacts the substrate 10. Alternatively, the press-on pin 48 may directly contact one of the semiconductor bodies 20. That is, a first end of the press-on pin 48 may be in direct contact with the substrate 10 or a semiconductor body 20. This, however, is only an example. It is also possible that one or more layers or elements are arranged between the press-on pin 48 and the substrate 10 or semiconductor body 20. That is, the press-on pin 48 may be arranged on the substrate 10 or semiconductor body 20, with its first end facing the substrate 10 or semiconductor body 20. However, any kind of connection layer or connecting element may be arranged between the press-on pin 48 and the substrate 10 or semiconductor body 20 such that the press-on pin 48 contacts the substrate 10 or semiconductor body 20 via the connection layer or connection element. The first end of the press-on pin 48, therefore, may transfer a press-on force to the substrate 10 or the semiconductor body 20 either directly or indirectly (e.g. via additional layers or components).

Figure 3:
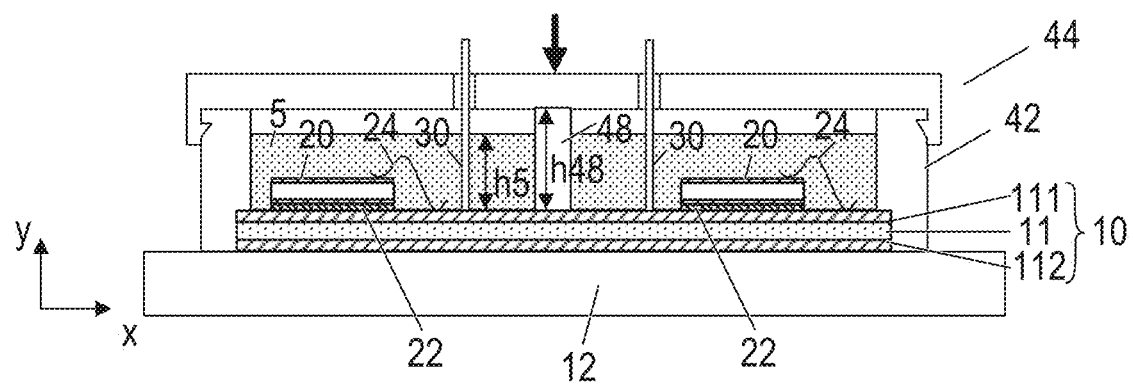
FIG. 3 is a cross-sectional view of a further power semiconductor module arrangement.

When the semiconductor module arrangement is fully assembled, the substrate 10 is pressed onto the ground surface 12 of the housing in order to reduce a thermal resistance between the substrate 10 and the ground surface 12. Further, the substrate 10 is thereby kept in a desired position and is prevented from shifting inside the housing. When the cover 44 is arranged on the sidewalls 42 to close the housing, the cover 44 contacts the second end of the press-on pin 48 and exerts a pressure on the press-on pin 48. A major force component of the pressure exerted on the press-on pin 48 is directed in the vertical direction y perpendicular to the top surface of the substrate 10. The press-on pin 48 extends from the substrate 10 or semiconductor body 20 towards the cover in a vertical direction y that is perpendicular to a top surface of the substrate 10 such that the cover can contact the press-on pin 48. The press-on pin 48 may be straight and extend entirely perpendicular to the top surface. It is, however, also possible that the press-on pin 48 is bent or tilted to a certain degree. This still allows the cover to exert a pressure on the press-on pin. While the semiconductor module arrangement illustrated in FIGS. 1 and 2 illustrates the cover 44 still partly open, FIG. 3 illustrates an example of a semiconductor module arrangement in a final mounting position (cover 44 fully closed). The bold arrows in the figures illustrate a direction in which the cover 44 is moved while closing the housing and a direction of the pressure exerted on the press-on pin 48 once the housing is fully closed.

The semiconductor module arrangement illustrated in FIG. 1 does not comprise a casting compound 5. A casting compound 5, however, is illustrated in the examples of FIGS. 2 to 6. When the semiconductor module arrangement comprises a casting compound 5, the press-on pin 48 is largely molded in the casting compound 5. However, a second end of the press-on pin 48 facing away from the substrate 10 or the semiconductor body 20 on which the press-on pin 48 is mounted protrudes from the casting compound 5. That is, a height $h48$ of the press-on pin 48 in a vertical direction y that is perpendicular to a top surface of the substrate 10 is greater than a height $h5$ of the casting compound 5 in the same direction. Therefore, a top surface of the press-on pin 48 facing away from the substrate 10 or the semiconductor body 20 on which the press-on pin 48 is mounted is not covered by the casting compound 5. In this way, the top surface may be easily contacted by the cover 44 even if the casting compound 5 has already been formed. The cover 44 then contacts the top surface of the press-on pin 48 (but not the casting compound 5) and exerts pressure on the top surface, thereby pressing the press-on pin 48 onto the substrate 10 (or onto the semiconductor body 20) and subsequently pressing the substrate 10 onto the ground surface 12. This allows the casting compound 5 to be formed even before the housing is fully closed, that is before arranging the cover 44 onto the sidewalls 42. When the casting compound 5 is formed, usually a liquid or viscous material is poured into the housing, thereby forming a liquid or viscous pre-layer. A heating step may follow during which liquid that is present in the pre-layer is at least partly evaporated. In this way, the pre-layer is hardened to form the resulting casting compound 5. Such a heating step may either be performed before arranging the cover 44 onto the sidewalls 42 or, alternatively, the heating step may be performed after mounting the cover 44 onto the sidewalls 42. When performing the heating step before mounting the cover 44 onto the sidewalls 42, the cover 44 needs not be exposed to the heat applied during the heating step. This may increase the overall lifetime of the cover 44, and thus of the complete semiconductor module arrangement because the material of the cover 44 does not become fragile or brittle when exposed to heat.

Even further, if the cover 44 is not yet mounted on the sidewalls 42, it is much easier to fill the liquid or viscous material into the housing. Undesired cavities in the casting compound 5 can be reduced or even avoided, as the material can be freely and evenly distributed over the entire surface of the substrate 10 while the cover is still open.

The casting compound 5, however, may be formed when the sidewalls 42 are already arranged to surround the substrate 10. As has been described above, the casting compound 5 is generally formed by forming a liquid or gel-like pre-layer that is subsequently hardened. The sidewalls 42 prevent the material of the pre-layer from unintentionally spreading before the hardening step.

The press-on pin 48 may comprise a solid body, for example. That is, the press-on pin 48 may comprise a main body that is entirely formed of a solid block of suitable material. According to an example, the press-on pin 48 may comprise a pin or cuboid having an angular or rounded cross-section. The casting compound 5 may then surround the press-on pin 48. As the press-on pin 48 does not have any cavities or holes, the casting compound 5 cannot extend into the press-on pin 48. According to another example, however, the press-on pin 48 may comprise at least one cavity or hole such that the casting compound 5 may at least partly fill the cavity or hole (not specifically illustrated).

In the examples illustrated in FIGS. 1 and 2, the sidewalls 42 of the housing are coupled to the substrate 10 and the substrate 10 is arranged on the ground surface 12. The cover 44 in these examples comprises a top part, covering the opening formed by the sidewalls 42, and side parts which extend perpendicular to the top part and parallel to the sidewalls 42 of the housing when the cover 44 is arranged on the substrate 10. The side parts of the cover 44 extend from the top part towards the ground surface 12. When the semiconductor module arrangement is fully assembled, the side parts may even contact the ground surface 12. For example, the side parts may be permanently coupled to the ground surface 12 in order to fix the cover 44 in place and prevent it from moving or falling off. For example, the cover 44 may be soldered or glued to the ground surface 12.

This, however, is only an example. As is exemplarily illustrated in FIG. 3, it is also possible that the cover 44 is permanently attached to the sidewalls 42 of the housing only. The cover 44 may be glued to the sidewalls 42 or may be attached to the sidewalls by means of any suitable mechanic fixing mechanism. In the example illustrated in FIG. 3, the cover 44 comprises projections which engage with corresponding counterparts provided in the sidewalls 42. The sidewalls 42 in this example are mounted on the ground surface 12 and may have a protrusion that contacts the edges of the substrate 10, thereby pressing the edges of the substrate 10 towards the ground surface 12.

Figure 5:
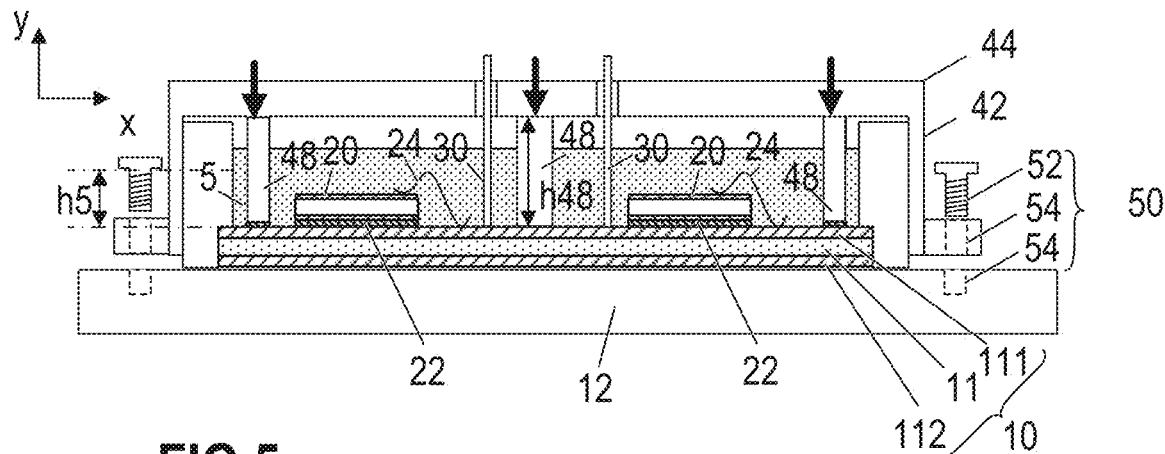
FIG. 5 is a cross-sectional view of a further power semiconductor module arrangement.

The example illustrated in FIG. 5 is somewhat similar to the examples illustrated in FIGS. 1 and 2. However, in the example of FIG. 5 the side parts of the cover 44 comprise projections with threaded holes 54. The ground surface 12 may also comprise threaded holes 54. The cover 44 in this example may be attached to the ground surface 12 by means of screws or bolts 52 that are inserted into the threaded holes 54. However, any other way of permanently mounting the cover 44 on the ground surface 12 is also possible.

Figure 4:
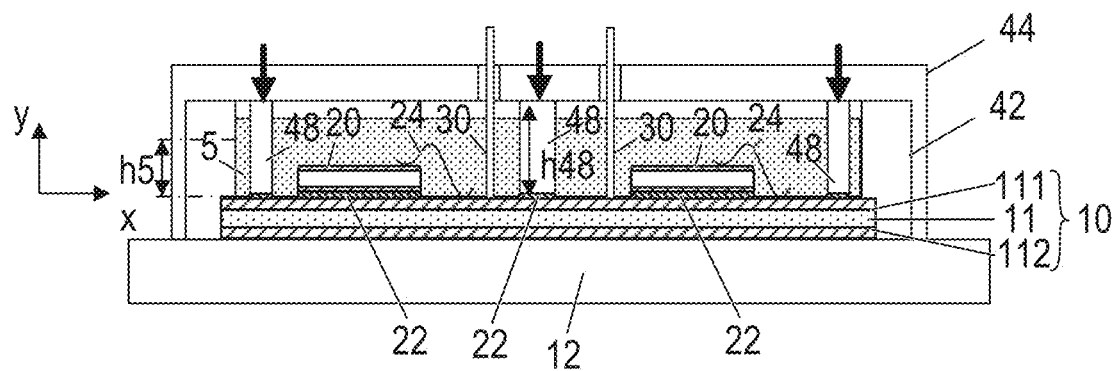
FIG. 4 is a cross-sectional view of a further power semiconductor module arrangement.

In the examples illustrated in FIGS. 1, 2 and 3, the semiconductor module arrangement only comprises one press-on pin 48. This, however, is only an example. As is illustrated in FIGS. 4 and 5, the semiconductor module arrangement may also comprise more than one press-on pin 48. In the examples illustrated in FIGS. 4 and 5, the semiconductor module arrangement comprises three press-on pins 48. However, any number n of press-on pins 48 with $n \geq 1$ is generally possible. When providing more than one press-on pin 48, the pressure exerted on the substrate 10 may be distributed more evenly over the substrate 10. However, a greater number of press-on pins 48 also increases the space requirements.

The at least one press-on pin 48 may comprise an electrically insulating material such as a plastic material, for example. However, according to another example it is also possible that the at least one press-on pin 48 comprises an electrically conducting material. In this way, the at least one press-on pin 48 may form a contact element which provides an electrical connection between the inside and the outside of the housing. The press-on pins 48 may be electrically coupled to the outside of the housing by any suitable means, for example, to allow the press-on pins 48 to be contacted from the outside of the housing. Alternatively or additionally, it is also possible that internal electrical connections are formed by means of the press-on pin 48. The press-on pins 48 may replace at least some of the terminal elements 30, for example. It is also possible that only some, but not all, of the press-on pins 48 are used as terminal elements, while other press-on pins 48 are electrically insulating and do not serve as terminal elements.

Figure 6:
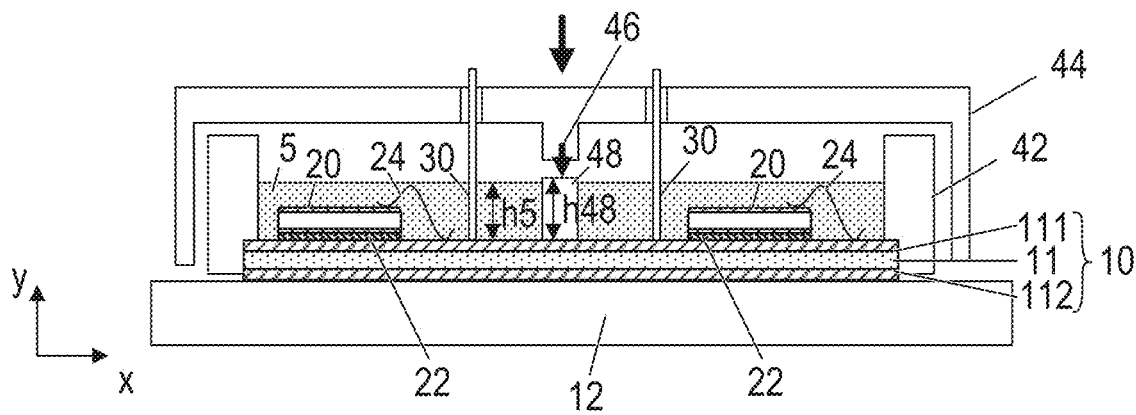
FIG. 6 is a cross-sectional view of a further power semiconductor module arrangement.

Now referring to FIG. 6, a power semiconductor module arrangement according to an even further example is schematically illustrated. In this example, the cover 44 comprises a protrusion 46. The protrusion 46 may be coupled to the cover 44 or may be integrally formed with the cover 44. The protrusion 46 may be coupled to the housing in any suitable way. For example, the protrusion 46 may be coupled to the housing by means of an adhesive bond, or a screwed or bolted connection. When the cover 44 is arranged on the sidewalls 42 to close the housing, the protrusion 46 contacts the press-on pin 48 and exerts a pressure on the press-on pin 48.

Figure 7:
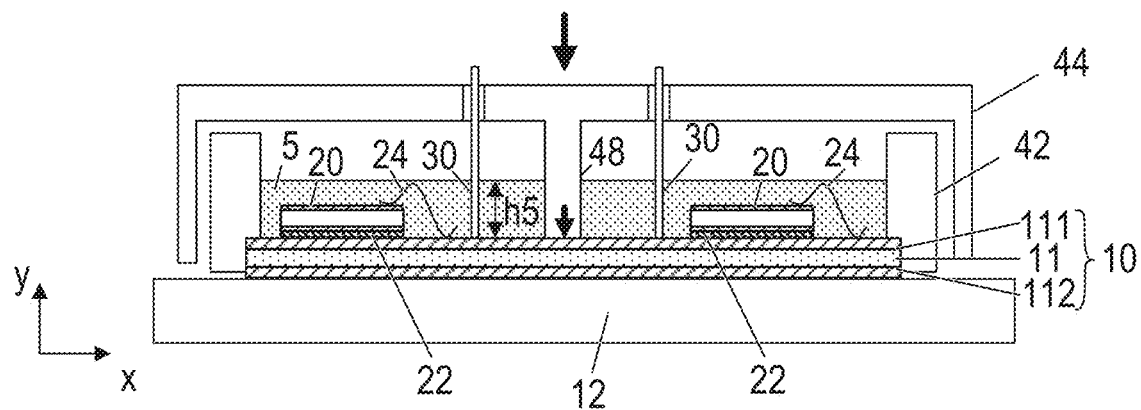
FIG. 7 is a cross-sectional view of a further power semiconductor module arrangement.

The press-on pin 48 as illustrated in the different examples above may be held in a desired position in different ways. For example, the press-on pin 48 may be mounted to the substrate 10 or to a semiconductor body 20 by means of an adhesive bond, or a suitable connection layer. Such connection layer may be a solder layer, a layer of an (electrically conductive) adhesive, or a layer of a sintered metal powder, e.g., a sintered silver powder, for example. This is schematically illustrated in FIGS. 1 to 6, for example. As is illustrated in FIG. 7, it is also possible that the at least one press-on pin 48 is mounted to the cover 44 of the housing or is monolithically (integrally) formed with the cover 44 of the housing. That is, the press-on pin 48 may be formed as a single piece together with the cover 44, or may be mounted to the cover 44 by means of an adhesive bond, or a suitable connection layer, for example. Such connection layer may be a solder layer, a layer of an (electrically conductive) adhesive, or a layer of a sintered metal powder, e.g., a sintered silver powder, for example. It is also possible to mount the press-on pin 48 to either the cover 44, or to the substrate 10 or semiconductor body 20 in any other suitable way, e.g., by means of a suitable mechanical connection.

Figure 8:
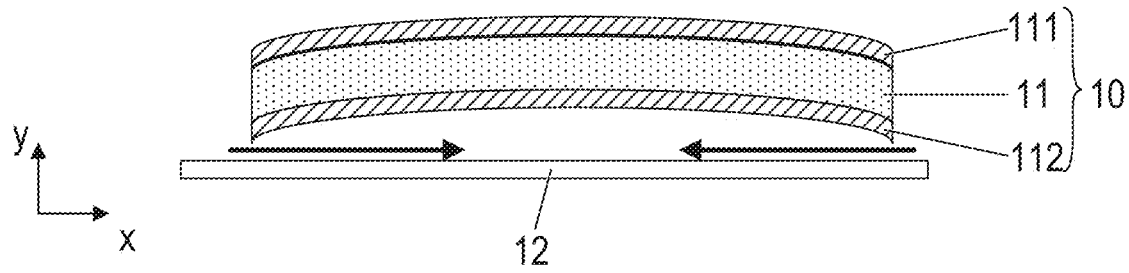
FIG. 8 is a cross-sectional view of a substrate of a power semiconductor module arrangement.

In the examples illustrated in FIGS. 1 to 7, a method for assembling a power semiconductor module generally comprises arranging the substrate 10 on the ground surface 12 and subsequently arranging the housing to enclose the substrate 10. When the housing is arranged to enclose the substrate 10, the press-on pin 48 exerts pressure on the substrate 10, thereby pressing the substrate 10 onto the ground surface 12. However, as is schematically illustrated in FIG. 8, the substrate 10 often has a certain bow or curvature. This curvature usually is a concave curvature with respect to the ground surface 12. The curvature results from applying the first and second metallization layers 111, 112 to the dielectric insulation layer 11, and further from mounting the semiconductor bodies 20 (not specifically illustrated in FIG. 8) on the substrate 10. The dielectric insulation layer 11 often bends due to the different expansion coefficients of the different elements during the above mentioned steps. Before arranging the substrate 10 on the ground surface 12, a material configured to form a connection layer is usually arranged on the ground surface 12. The material initially is fluid or viscous and is hardened once the substrate 10 has been arranged on the material. When the curved substrate 10 is arranged on this fluid or viscous material, the concave curvature results in a "squeeze-in" effect. That is, the material, which is applied evenly on the ground surface 12, is displaced from below the edges of the substrate 10 to below the center of the substrate 10 to a certain degree, as is indicated with arrows in FIG. 8. Therefore, the resulting connection layer (not specifically illustrated) may be thicker below the center of the substrate 10 and thinner below the edges of the substrate. This results in a non-uniform heat dissipation from the substrate 10 to the ground surface 12.

The uneven thickness of such a connection layer usually even remains after arranging the housing on the substrate 10 and pressing the substrate 10 on the ground surface 12 by means of the press-on pin 48, with the connection layer arranged between the substrate 10 and the ground surface 12. The press-on pin 48 presses the substrate 10 on the connection layer and the ground surface 12. However, as the connection layer has already been hardened at this point of the assembly, the thickness of the layer will essentially remain the same, even if the press-on pin 48 exerts pressure of the substrate 10 and the connection layer. The large thickness of the layer below the center of the substrate 10 has an increased thermal resistance which decreases the overall thermal conductivity.

Figure 9A:
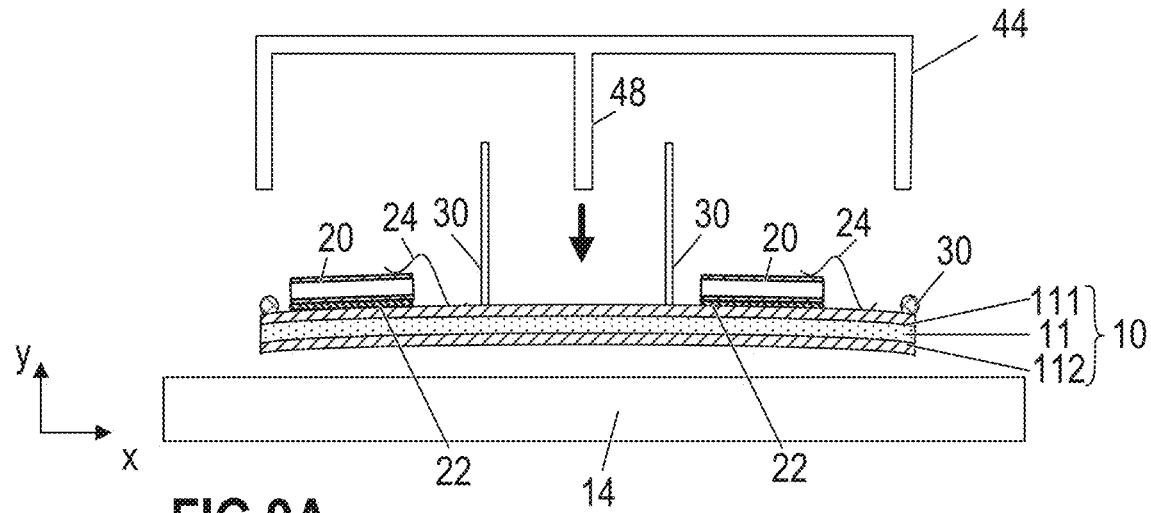
FIGS. 9A to 9C schematically illustrate a method for assembling a power semiconductor module according to one example.
Figure 9B:
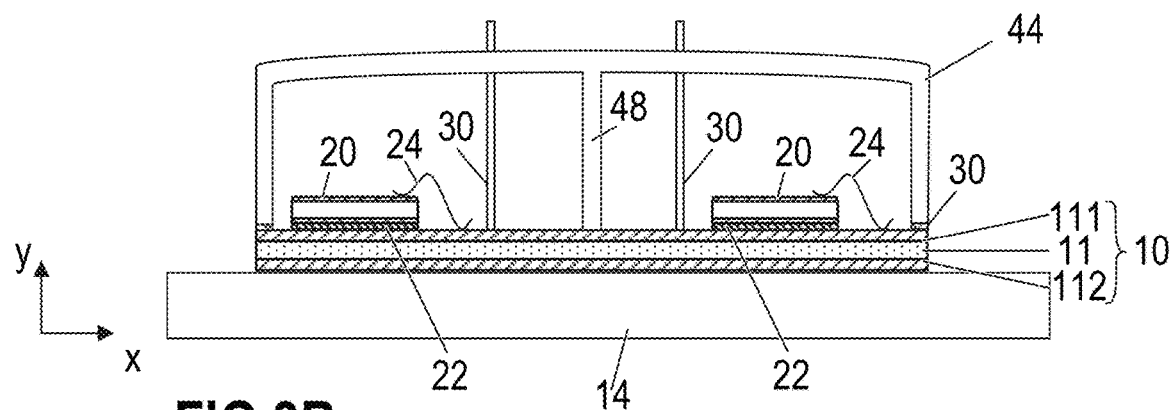
Figure 9C:
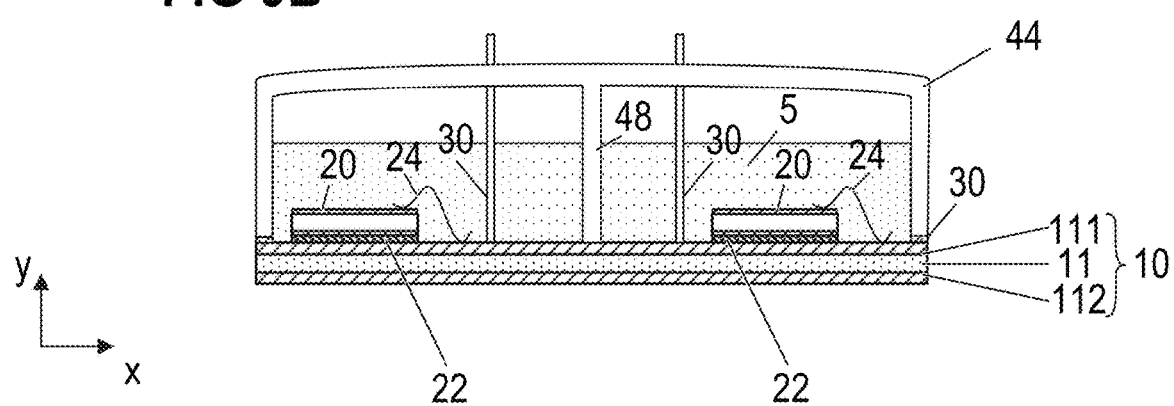

According to one embodiment, therefore, the housing is mounted to the substrate 10 before mounting the substrate 10 to the ground surface. This is schematically illustrated in FIGS. 9A to 9C. As is illustrated in FIG. 9A, the housing 44 is mounted to the substrate 10 and is attached to the substrate 10, e.g., by means of an adhesive bond. That is, an adhesive 30 may be arranged on the substrate 10 (see FIG. 9A) or on the sidewalls 42 of the housing (not specifically illustrated). The housing may then be arranged on the substrate 10 with the adhesive 3 arranged between the substrate 10 and the housing (see FIG. 9B). During this process, the substrate 10 may be arranged on a work surface 14. The substrate 10, however, is not permanently mounted to the work surface 14 and may be removed from the work surface 14 without causing any damages to the substrate 10 once the housing has been mounted to the substrate 10.

In the example illustrated in FIGS. 9A to 9C, the housing comprises a press-on pin 48, similar to what has been described with respect to FIG. 7 above. When mounting the housing to the substrate 10, the press-on pin 48 directly or indirectly contacts a desired point of contact on the substrate 10 or on one of the semiconductor bodies 20 arranged on the substrate 10 first, before the sidewalls 42 of the housing contact their intended contact points on the substrate 10. In this way, the press-on pin 48 exerts pressure on the center of the substrate 10 without a connection layer arranged below the substrate 10, and the concave bow of the substrate 10 is at least partly removed. A major force component of the applied pressure is directed in the vertical direction y perpendicular to the top surface of the substrate 10. When the housing is in its final mounting position, the substrate 10 may be flat, as is illustrated in FIGS. 9B and 9C, or may even have a convex bow (not specifically illustrated). It is, however, also possible that the substrate 10 is not entirely flat but the initial concave bow of the substrate 10 is reduced to a certain degree. In a subsequent step which is schematically illustrated in FIG. 9C, a casting compound 5 may be filled into the housing, as has been described above.

The power semiconductor module may then be removed from the work surface 14. The power semiconductor module arrangement subsequently may be mounted to a ground surface 12 with the housing already mounted to the substrate 10. If the substrate 10 still has a (reduced) concave bow, a connection layer that is arranged between the ground surface 12 and the substrate 10 may have a greater thickness in areas below a central area of the substrate 10, and may have a lower thickness in areas below the edges of the substrate 10. However, a deviation between the different thicknesses may be marginal. If the substrate 10 is flat, a connection layer having an even thickness may be formed between the substrate 10 and the ground surface 12. In case of a convex bow of the substrate (not specifically illustrated), some of the material forming the connection layer is squeezed out from under the center of the substrate 10 towards the edges of the substrate, resulting in a thinner layer below the center and a thicker layer below the edges of the substrate 10. The thermal resistance of the connection layer below the substrate may be decreased in this way, allowing for a satisfying heat dissipation.

While the substrate 10 is bent out of its initial concave form, the housing may also be deformed to a certain degree due to the pressure exerted on the substrate 10. The cover 44, for example, may comprise at least one flexible portion. According to one example, the entire cover 44 is flexible, according to another example, only certain sections of the cover 44 are flexible. The substrate 10 in at least a first area, e.g., an area vertically below the press-on pin (i.e., the area that is directly or indirectly contacted by the press-on pin 48), generally comprises a first spring constant $k_1$ in the vertical direction y. The at least one flexible portion of the cover 44 comprises a second spring constant $k_2$. The spring constant generally depends on the material and a thickness of the material, for example. The first spring constant $k_1$ and the second spring constant $k_2$ may be the same or at least similar. According to one example, the following applies $0.5*k_1 \leq k_2 \leq 5*k_1$. According to another example, the second spring constant $k_2$ may be the first spring constant $k_1 \pm 50\%$. In this way, the substrate 10 and the flexible portion of the housing are bent to a similar extent. The cover 44 of the housing may be flat in an initial position (see, e.g., FIG. 9A). When mounting the housing to the substrate 10, the cover 44 is bent out of this initially flat position away from the substrate (see, e.g., FIGS. 9B and 9C). In this way, production tolerances of any components of the power semiconductor module can be compensated without damaging the substrate 10, the housing, or any other components of the power semiconductor module.

For example, the press-on pin 48 can be comparably long in order to guarantee that in its final mounting position it contacts both the substrate 10 (or the semiconductor body) directly or indirectly and the cover 44, even if it turns out somewhat shorter than intended due to production tolerances. As the flexible portion of the cover 44 and the substrate 10 bend equally due to the similar spring constants, damages to the substrate 10 or the housing can be prevented even if the press-on 48 pin turns out somewhat longer than intended due to production tolerances. A shifting or tilting of the housing which may result in an unequal distribution of pressure applied on the substrate 10 can also be prevented.

The housing and the press-on pin 48 may be implemented in many different ways. In the example illustrated in FIGS. 9A to 9C, the sidewalls 42, the cover 44 and the press-on pin 48 are implemented as a single component. This, however, is only one example. Instead of being formed as a part of the housing or being coupled to the housing by means of, e.g., an adhesive bond, it is also possible that the press-on pin 48 is arranged on the substrate 10, similar to what has been described with respect to FIGS. 1 to 6 above. It is also possible that the cover 44 and the sidewalls 42 are formed as two separate parts as illustrated in FIGS. 1 to 7, for example. It is also possible that the cover 44 comprises a protrusion 46, as has been described with respect to FIG. 6 above.

Figure 10:
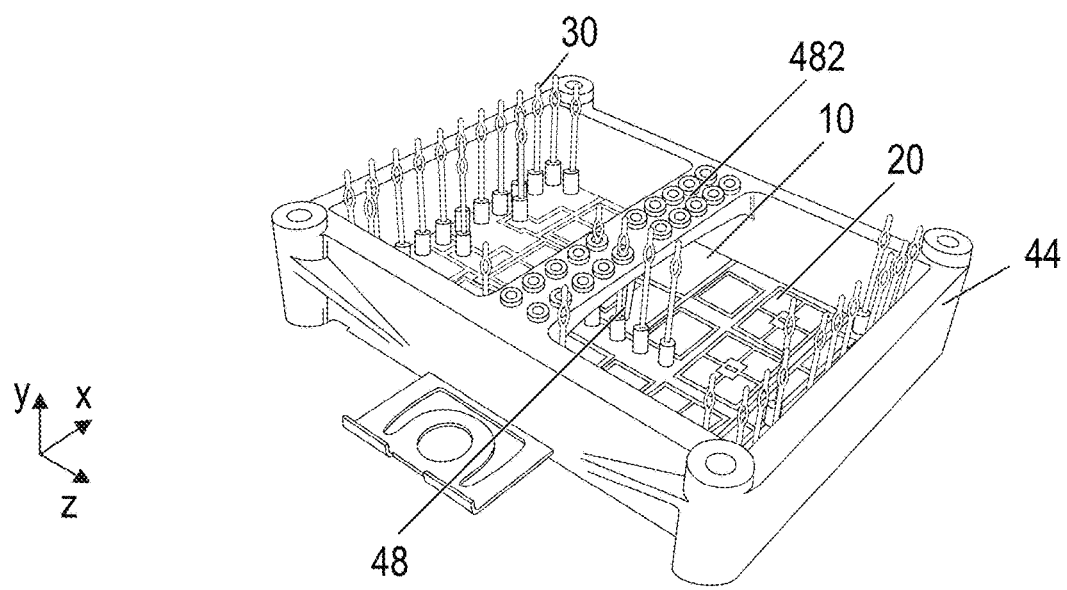
FIG. 10 is a three-dimensional view of a power semiconductor module arrangement according to another example.

Now referring to FIG. 10, it is possible that the flexible portion 482 only partly covers the housing. In this specific example, the flexible portion 482 is implemented as a bar, extending horizontally between two opposite sidewalls 42 of the housing in parallel to a top surface of the substrate 10. The top surface of the substrate 10 is a surface on which the semiconductor bodies 20 are mounted. The press-on pin 48 may be arranged centrally between the opposing sidewalls 42, for example. Due to the arrangement of semiconductor bodies 20 and any other components on the substrate 10, however, it is also possible that a distance between the press-on pin 48 and a first wall is different from a distance between the press-on pin 48 and the opposing second wall. Depending on the overall size (cross-sectional area) of the power semiconductor module arrangement, fixing the press-on pin 48 to more than two sidewalls 42 may provide more stability to the arrangement. According to other examples (not specifically illustrated), it is also possible that the flexible portion 482 forms a cross above the substrate 10 and is further coupled to a third and an opposing fourth sidewall in a similar fashion as it is coupled to the first and the second sidewall. The flexible portion 482 in these examples may form a cover 44 only partially covering the housing. It is, however, also possible, that a separate cover is provided (not specifically illustrated in FIG. 10) which completely covers the housing. Generally, the at least one flexible portion 482 may form a cover 44 or may be part of a cover 44, and may have any suitable size or form. Instead of an elongated form as is exemplarily illustrated in FIG. 10, it is also possible that the flexible portion 482 has a square form or a rounded form, for example. Any other form is generally possible.

Figure 11A:
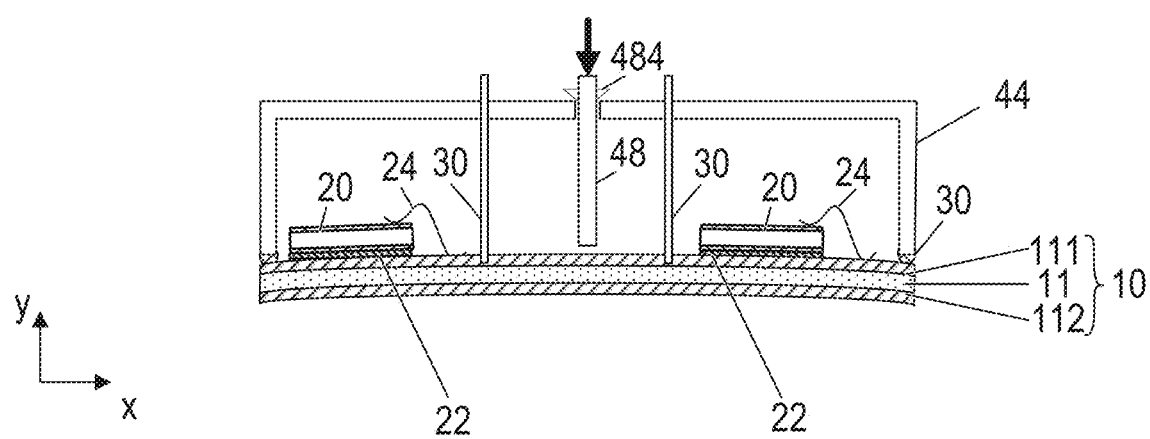
FIGS. 11A and 11B schematically illustrate a method for assembling a power semiconductor module according to another example.
Figure 11B:
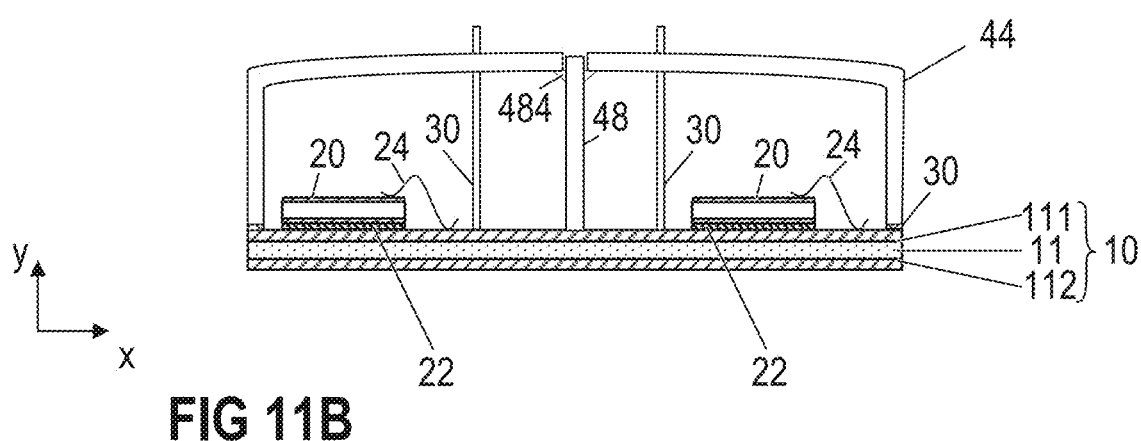

In the examples described with respect to FIGS. 9A-9C and 10 above, the press-on pin 48 exerts pressure on the substrate 10 as soon as the housing is mounted to the substrate 10. As is schematically illustrated in FIGS. 11A and 11B, however, it is also possible that the housing is mounted to the substrate 10 first, and the pressure is only applied at a later point. In the example illustrated in FIGS. 11A and 11B, the cover 44 comprises a through hole. After mounting the housing to the substrate 10, a press-on pin 48 may be inserted through the through hole, as is illustrated in FIG. 11A, for example. The press-on pin 48, according to another example, may also be inserted through the through-hole before mounting the housing to the substrate 10. However, in the latter case the press-on pin 48 may not yet be in its final mounting position such that it does not immediately exert pressure on the substrate 10 when the housing is mounted to the substrate 10. At any time between mounting the housing to the substrate 10 and mounting the substrate 10 on a ground surface, the press-on pin 48 may be pushed into the housing and towards the substrate 10, thereby exerting pressure on the substrate 10 and bending the substrate 10 out of its initially concave form. This is schematically illustrated in FIG. 11B.

In the example illustrated in FIGS. 11A and 11B, the press-on pin 48 comprises a collar 484 which is flexible to a certain extent such that it can be pushed through the through hole of the cover 44 and into the housing. Once inside the housing, the collar 484 unfurls and prevents the press-on pin 48 from moving in a vertical direction y. The press-on pin 48 in its final mounting position exerts pressure on both the substrate 10 and the flexible portion 482 of the housing and is securely clamped between the substrate 10 and the flexible portion. A small portion of the press-on pin 48 may remain inside the through hole, for example, thereby providing further stability by preventing the press-on pin 48 from moving in a horizontal direction x. The collar 484 illustrated in FIG. 11, however, is only one example. The same result may be achieved in many different ways.

According to another example which is not specifically illustrated, the press-on pin 48 comprises a pressfit pin at its second end facing away from the substrate 10. The pressfit pin may be inserted in the respective through hole of the flexible portion, the through hole forming a counterpart for the pressfit pin. When not yet connected to its counterpart, a pressfit pin has a larger width than the counterpart. The width of the pressfit pin is a width in a horizontal direction x parallel to the top surface of the substrate 10. During the press-in process, the pressfit pin is pushed into the counterpart. This results in a plastic deformation of the pressfit pin. When inserted into the counterpart, the width of the pressfit pin is reduced. Only small insertion forces are generally necessary, while at the same time, high holding forces result. The pressfit pin and the counterpart are firmly attached to each other after the pressfit pin is inserted. The reduced width of the pressfit pin results in a force which counteracts the compression of the pressfit pin. When the pressfit pin of a press-on pin 48 is inserted in the through hole, the flexible portion of the cover 44 may not be easily detached from the press-on pin 48.

One advantage of the arrangement described by means of FIGS. 11A and 11B is that the process of mounting the housing to the substrate 10 is somewhat less elaborate as compared to the arrangements of FIGS. 9A-9C and 10. This is, because no pressure is yet exerted on the substrate 10 when the housing is mounted to the substrate. The process of pushing the press-on pin 48 into the housing can be implemented comparably easy.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
    a substrate comprising a dielectric insulation layer and a first metallization layer attached to the dielectric insulation layer;
    a semiconductor body mounted to the first metallization layer;
    a housing at least partly enclosing the substrate, the housing comprising sidewalls and a cover, the cover at least partly covering an opening formed by the sidewalls and comprising a flexible portion; and
    a press-on pin comprising a first end and a second end, wherein the press-on pin is arranged on the substrate or the semiconductor body, the first end of the press-on pin facing the substrate or the semiconductor body and extending from the substrate or the semiconductor body towards the cover such that the second end contacts the flexible portion of the cover,
    wherein the substrate in an area vertically below the press-on pin comprises a first spring constant ($k_1$) in a vertical direction that is perpendicular to a top surface of the substrate,
    wherein the flexible portion of the cover comprises a second spring constant ($k_2$) and $0.5*k_1 \leq k_2 \leq 5*k_1$.

2. The power semiconductor module of claim 1, wherein the cover exerts pressure on the press-on pin such that the press-on pin is pressed onto the substrate or the semiconductor body.

3. The power semiconductor module of claim 1, wherein the substrate is flat or has a convex bow, and wherein the flexible portion of the cover has a concave bow.

4. The power semiconductor module of claim 1, further comprising a casting compound covering the substrate and partly filling the housing, wherein the casting compound has a thickness in the vertical direction, and wherein the press-on pin has a height in the vertical direction that is greater than the thickness of the casting compound such that the second end of the press-on pin that faces away from the substrate or the semiconductor body is not covered by the casting compound.

5. The power semiconductor module of claim 1, wherein the press-on pin is monolithically formed with the flexible portion.

6. The power semiconductor module of claim 1, wherein the press-on pin is mounted to the flexible portion by an adhesive bond, a solder layer, a layer of a sintered metal powder, or a mechanical connection.

7. The power semiconductor module of claim 1, wherein the flexible portion of the cover comprises a through hole, wherein the second end of the press-on pin extends into the through hole, and wherein the second end faces away from the substrate.

8. The power semiconductor module of claim 1, wherein the press-on pin comprises an electrically insulating material.

9. The power semiconductor module of claim 1, wherein the press-on pin comprises a solid body.

10. A housing for a power semiconductor module, the housing comprising sidewalls and a cover, the cover at least partly covering an opening formed by the sidewalls and comprising a flexible portion,
    wherein the housing is configured to at least partly enclose a substrate that comprises a dielectric insulation layer and a first metallization layer attached to the dielectric insulation layer, with a semiconductor body mounted to the first metallization layer,
    wherein the substrate in at least a first area comprises a first spring constant ($k_1$) in a vertical direction that is perpendicular to a top surface of the substrate,
    wherein the flexible portion of the cover comprises a second spring constant ($k_2$) and $0.5*k_1 \leq k_2 \leq 5*k_1$.

11. The housing of claim 10, further comprising a press-on pin comprising a first end and a second end, wherein the second end of the press-on pin contacts the flexible portion of the cover, and wherein the press-on pin extends from the cover such that the first end faces away from the cover.

* * * * *